United States Patent
Wang et al.

(10) Patent No.: US 11,926,017 B2
(45) Date of Patent: Mar. 12, 2024

(54) METHOD AND APPARATUS FOR CLEANING PROCESS MONITORING

(71) Applicant: Taiwan Semiconductor Manufacturing Co., Ltd., Hsinchu (TW)

(72) Inventors: Charlie Wang, Hsinchu (TW); Yu-Ping Tseng, Taipei (TW); Y. J. Chen, Taoyuan (TW); Wai-Ming Yeung, Hsinchu (TW); Chien-Shen Chen, Hsinchu (TW); Danny Kuo, Taipei (TW); Yu-Hsuan Hsieh, New Taipei (TW); Hsuan Lo, New Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 112 days.

(21) Appl. No.: 17/308,767

(22) Filed: May 5, 2021

(65) Prior Publication Data
US 2021/0252668 A1   Aug. 19, 2021

Related U.S. Application Data

(62) Division of application No. 15/940,749, filed on Mar. 29, 2018, now Pat. No. 11,007,620.
(Continued)

(51) Int. Cl.
| B08B 3/14 | (2006.01) |
| B08B 1/00 | (2006.01) |
| B08B 3/00 | (2006.01) |
| B24B 37/013 | (2012.01) |
| B24B 53/017 | (2012.01) |

(Continued)

(52) U.S. Cl.
CPC ............ B24B 53/017 (2013.01); B08B 1/002 (2013.01); B08B 3/00 (2013.01); B08B 3/14 (2013.01); B24B 37/013 (2013.01); C02F 1/00 (2013.01); H01L 21/02052 (2013.01);
(Continued)

(58) Field of Classification Search
None
See application file for complete search history.

(56) References Cited

U.S. PATENT DOCUMENTS

4,788,043 A * 11/1988 Kagiyama ................ B01D 3/36
                                                          422/292
5,511,569 A *  4/1996 Mukogawa ............... B08B 3/08
                                                          134/155
(Continued)

Primary Examiner — Cristi J Tate-Sims
(74) Attorney, Agent, or Firm — Duane Morris LLP (57) ABSTRACT

A cleaning process monitoring system, comprising: a cleaning container comprising an inlet for receiving a cleaning solution and an outlet for draining a waste solution; a particle detector coupled to the outlet and configured to measure a plurality of particle parameters associated with the waste solution so as to provide a real-time monitoring of the cleaning process; a pump coupled to the cleaning container and configured to provide suction force to draw solution through the cleaning system; a controller coupled to the pump and the particle detector and configured to receive the plurality of particle parameters from the particle detector and to provide control to the cleaning system; and a host computer coupled to the controller and configured to provide at least one control parameter to the controller.

20 Claims, 4 Drawing Sheets

Related U.S. Application Data

(60) Provisional application No. 62/585,746, filed on Nov. 14, 2017.

(51) Int. Cl.
*C02F 1/00* (2023.01)
*H01L 21/02* (2006.01)
*H01L 21/67* (2006.01)

(52) U.S. Cl.
CPC .. *H01L 21/02074* (2013.01); *H01L 21/67028* (2013.01); *H01L 21/67253* (2013.01)

(56) References Cited

U.S. PATENT DOCUMENTS

| | | | | |
|---|---|---|---|---|
| 5,647,386 A | * | 7/1997 | Kaiser | B08B 3/12 134/113 |
| 2003/0154999 A1 | * | 8/2003 | Shih | B08B 3/00 134/3 |
| 2018/0156727 A1 | * | 6/2018 | Zhang | G01N 1/22 |

* cited by examiner

METHOD AND APPARATUS FOR CLEANING PROCESS MONITORING

CROSS-REFERENCE TO RELATED APPLICATION

This application is a division application of U.S. patent application Ser. No. 15/940,749, filed Mar. 29, 2018, which claims priority to U.S. Provisional Patent Application No. 62/585,746, filed on Nov. 14, 2017, each of which are incorporated by reference herein in their entireties.

BACKGROUND

With the rapid shrinking of device dimensions and the strict requirements of achieving extremely smooth surfaces, there is an increasing need for global surface planarization of various thin films in the front- and back-end processes using chemical mechanical planarization (CMP). During CMP, the pad material and the wafer surface are in intimate contact in the presence of slurry. The slurry particles remain on the wafer surface at the end of the CMP process, and if not removed, they can cause various types of defects (scratches, corrosion spots, etc.) in the subsequent processing steps, which affects the functionalization of the integrated circuit (IC). These defects, in some instances, may also arise from the pad and the diamond disc conditioner. The other common forms of contaminants include organic residues and metallic impurities. The residues typically originate from slurry additives or the pad material and require subsequent processing such as plasma ashing or an oxidant (e.g., peroxide)-based chemical cleaning. The metallic impurities that are left on the surface in concentrations of $10^{11}$-$10^{12}$ atoms $cm^{-2}$ emanate either from abrasion caused to the metal lines or from metal ions present in the slurry. Particulate contamination in the form of abrasive particles, precipitates, or fragments of films and pad can enhance local surface roughness, impact the photolithography process by blocking the UV light, or cause shorting when the particles are conductive. Metallic impurities can affect electrical characteristics when they are highly mobile or cause dissolution of silicon in the case of more noble metal ions. Organic residues influence the wettability of the films and reduce the adhesion of deposited films. In an effort to significantly lower the defect density on various films prior to the next processing step, the demand for an effective and efficient post-CMP cleaning process has been continuously rising.

Among all possible forces, the dominant ones are van der Waals adhesion forces from dipole-dipole interactions and double-layer interactions from adsorption of specific ions in the solution due to their higher magnitude compared to other forces for the same size of the particle.

Different post-CMP cleaning methods are used for removal of particles, organic, and metal such as, for example batch cleaning of a cassette of wafers which involves rinsing and megasonic cleaning in chemicals followed by rinsing with DI water and single wafer cleaning using brush scrubber and/or megasonic actuators. Despite of different cleaning methods, different cleaning chemistries are selected based on the potential type of contaminations from the previous deposition process or CMP process, as well as the material of the surface. All cleaning methods involve the use of liquid chemicals with various chemical compositions and traditionally, the cleaning design is based on experiment and time when the configuration to other parameters are fixed e.g., solution temperature, solution pH, rotation speed, contact distance, contact pressure, actuator power, actuation frequency and etc. Furthermore, to ensure a near-complete particle removal, excessive chemicals and time are dedicated yet wasted. Therefore, there exists a need for the development of a method and a system for end point detection in a post-CMP cleaning process.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and a system for cleaning process monitoring during a post-CMP cleaning. Such system can be integrated to a cleaning container or cleaning apparatus at a downstream of the cleaning solution (e.g., in a drain pipe). By monitoring the particle level including particle size and number and comparing the measured particle level to a required particle level, a cleaning end point can be detected. Based on the real-time monitoring of the particle level, cleaning time can be adjusted accordingly. This method allows an effective cleaning of the substrate with customized cleaning time without over cleaning the wafer surface such that the cleaning damage can be minimized. At the same time, this method reduces the amount of chemical waste generated and reduce the cleaning time in the entire manufacturing process. Most importantly, this method allows to maximize the production yield by assuring an effective cleaning on each substrate after CMP. Accordingly, the above-mentioned issues maybe advantageously avoided.

This description of the exemplary embodiments is set to be understood in connection with the figures of the accompanying drawing, which are to be considered part of the entire written description. In the description, relative terms such as "lower," "upper," "horizontal," "vertical," "above,"

"below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

The presented disclosure provides various embodiments of a method and a system for detecting endpoint in a post-chemical-mechanical planarization process. During the post-CMP cleaning process, a number of steps in which a rinsing process is used can be integrated with this presented real-time end point detection system. This presented real-time continuous monitoring system is integrated to the drain pipelines of cleaning containers. By analyzing the drain solution and monitoring the particle concentration therein, the cleaning process for different wafers can be customized based on their own needs for cleaning rather than using a predefined recipe for all wafers. On one hand, this presented system can ensure a high-quality cleaning and on the other hand, it can reduce the cleaning time and minimize the chemical waste created in the cleaning process. Accordingly, the above-mentioned environmental and security issues maybe advantageously avoided.

Figure 1:
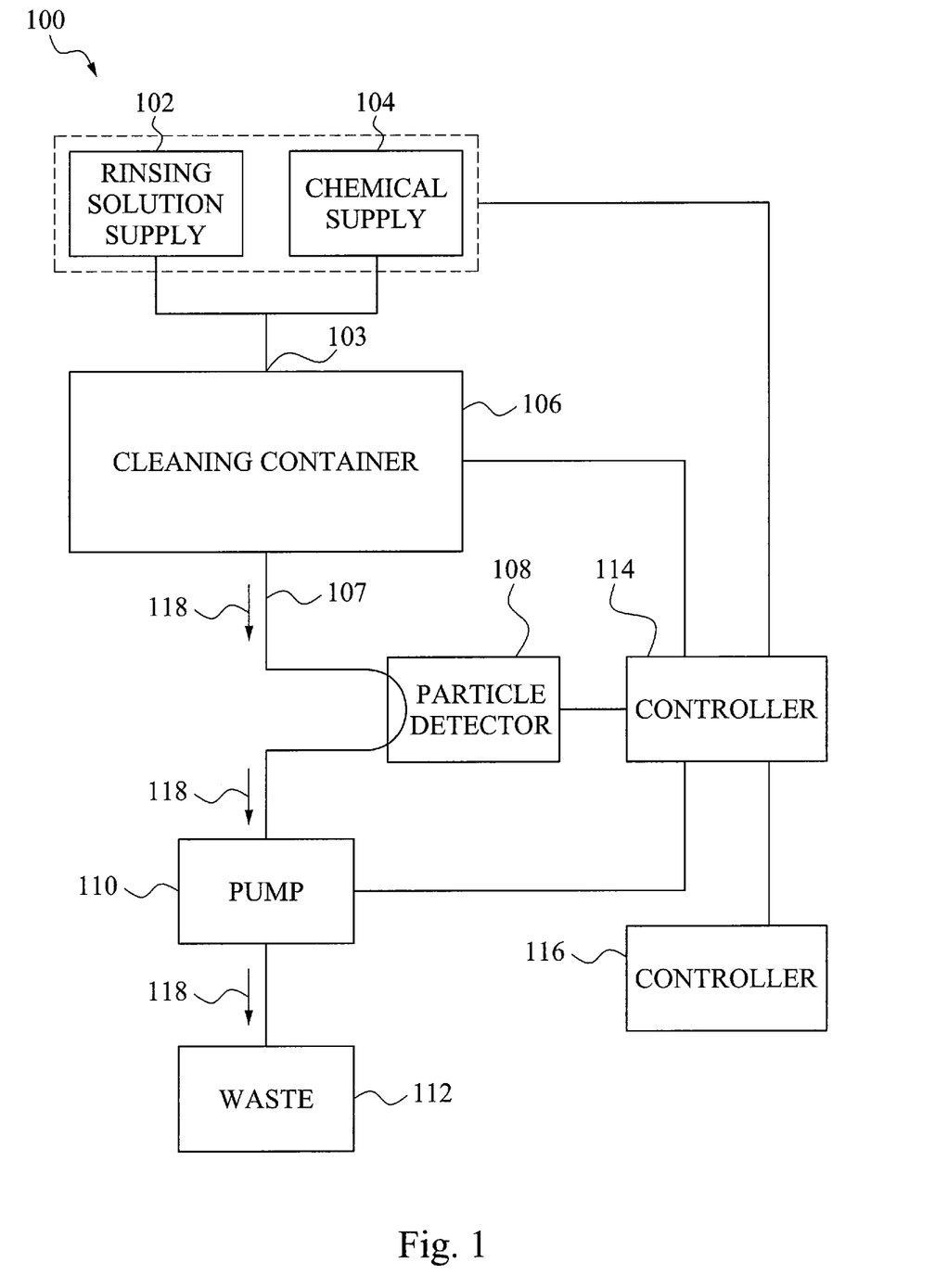
FIG. 1 illustrates a block diagram showing an exemplary configuration of a cleaning processing monitoring system integrated to a post-CMP cleaning system, in accordance with some embodiments of the present disclosure.

FIG. 1 illustrates a block diagram showing an exemplary configuration of a cleaning processing monitoring system 100 integrated to a post-CMP cleaning system, in accordance with some embodiments of the present disclosure. The monitoring system 100 comprises a rinsing solution supply 102, a chemical supply 104, a cleaning container 106, a particle detector 108 connected to the container 106 through a drain pipe 107, an effluent pump 110, an effluent reservoir 112, a controller 114 and a host computer 116, according to some embodiments. The rinsing solution from the rinsing solution supply 102 enters the container 106 through a first input port. In some embodiment, the rinsing solution can be deionized (DI) water. The chemical supply 104 may contain surfactants, ammonium hydroxide (NH4OH) solution, isopropanol (IPA), methanol, hydrofluoric (HF) acid, citric acid, tetraethyl ammonium hydroxide (TMAH), hydrogen peroxide, and etc., according to the particular slurry and/or contaminants that are involved in the CMP process. The chemical from the chemical supply 104 enters the cleaning container 106 through a second input port. In some embodiments, the rinsing solution (e.g., DI water) and chemical from the rinsing solution supply 102 and the chemical supply 104, respectively, can be premixed at a predefined concentration so as to prepare a cleaning solution before entering the cleaning container 106 at a single input port 103. In some embodiments, the cleaning container 106 comprises at least one cleaning head (not shown) to guide the rinsing or cleaning solution to the surface of a wafer.

In some embodiments, the particle detector 108 is connected to the cleaning container 106. Effluent 118 flows through the drain pipe 107 of the cleaning container 106 into the particle detector 108 which counts the number of particles per liter of effluent. The particle detector 108 is further connected to a pump 110. Effluent 118 passes from the container 106 to the particle detector 108 and then through the pump 110 which provides the suction force to draw cleaning solution waste through the system 100. Finally, the effluent 118 is released to a drain or a collection reservoir 112.

In some embodiments, an ideal particle detector 108 is compatible to the cleaning chemical environment and temperature for detecting particle levels should have the following properties, including low drift and noise level, high sensitivity, fast response time, wide linear dynamic range, low dead volume, insensitivity to measurement conditions (e.g., solvent, flow rate, and temperature), simple operation, high reliability, compact size/weight, and low power consumption, in accordance with various embodiments. In some embodiments, the particle detector 108 can be a laser-based particle counter. Typically, the particle detector 108 has a plurality of channels that are particularly designed for detecting particles of different sizes. In some embodiments, the channel size of a particle detector 108 can be at least one of the following: 20, 50, 70, 100, 150, 200 and 500 nm. In some embodiments, the flow rate for a particle detector 108 can be in a range of 10 milliliter per minute (mL/min) to 1 liter per minute (L/min). Selection of the particle detector 108 are determined by application, for example the particle concentration and typical particle sizes that are involved in the fabrication process. In some embodiments, the particle detector 108 can be an Ultrachem 100 liquid particle counter.

In some embodiments, the particle detector 108 is electrically coupled to a controller 114 and a host computer 116. Concentrations of particles of various sizes can be measured in real-time and then transmitted from the particle detector 108 to the controller 114 and then displayed on the host computer 116 in a predetermined format. The particle concentration in the effluent 118 in the downstream pipe is then compared to a pre-defined value in the controller 114. When the particle concentration is greater than the pre-defined value, the controller 114 continues the cleaning process by properly operating the control elements (e.g., valves, heaters, etc) on the rinsing solution supply 102, chemical supply 104, the rinsing apparatus in the cleaning container 106 and the pump 110, such that the cleaning time can be adjusted according to the measured particle concentration. When the particle concentration is equal to or smaller than the pre-defined value, the controller 114 continues the cleaning process in a similar fashion described above by a pre-defined time period and terminates the cleaning process such that the wafer can then be unloaded from the cleaning container to the next step of the fabrication process, e.g., a next cleaning step or a next fabrication step. In some embodiments, the pre-defined value can be 10000 particles per milliliter.

In some embodiments, the host computer 116 configures at least one control parameter to the controller 114 including ramping speed, response time, etc. In some embodiments, the controller 114 can adjust the pump speed in the downstream to provide an optimized condition, including flow rate and pressure for the particle detector 108 to properly detect different particles sizes and concentrations. In some embodiments, the controller 114 can also adjust the flow using a flow controller/regulator (not shown) in the particle detector 108.

Figure 2:
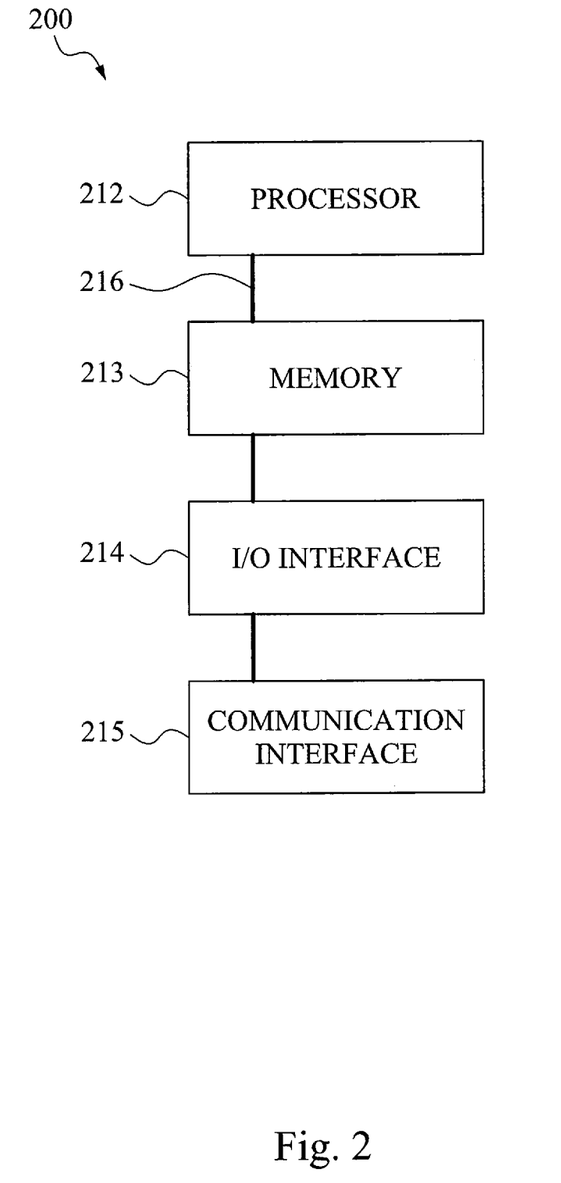
FIG. 2 illustrates a block diagram of the controller of the system shown in FIG. 1, in accordance with some embodiments of the present disclosure.

FIG. 2 illustrates a block diagram of the controller 114 of the system 100 shown in FIG. 1, in accordance with some embodiments of the present disclosure. The controller 114 in the system 100 may comprise a processor, a memory, an input/output interface (hereinafter "I/O interface"), a communications interface, and a system bus. In some embodiments, components in these units in the system 100 may be combined or omitted such as, for example, not including the communications interface. In some embodiments, the controller 114 of the system 100 may comprise other components not shown in FIG. 2. For example, these controller 114 of the system 100 also may comprise a power subsystem providing power to the light source. In other embodiments, these controller 114 of the system 100 may comprise several instances of the components shown in FIG. 2.

The processor 212 may comprise any processing circuitry operative to control the operations and performance of the controller 114 of the system 100. In various aspects, the processor 212 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor subsystem 406 also may be implemented by a controller, a microcontroller, an application specific integrated circuit (ASIC), a field programmable gate array (FPGA), a programmable logic device (PLD), and so forth.

In various aspects, the processor 212 may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory 213.

In some embodiments, the memory 213 may comprise any machine-readable or computer-readable media capable of storing data, including both volatile/non-volatile memory and removable/non-removable memory. The memory 213 may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the controller 114 of the system 100.

For example, memory 213 may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 213 may contain an instruction set, in the form of a file for executing a method of generating one or more timing libraries as described herein. The instruction set may be stored in any acceptable form of machine readable instructions, including source code or various appropriate programming languages. Some examples of programming languages that may be used to store the instruction set comprise, but are not limited to: Java, C, C++, C#, Python, Objective-C, Visual Basic, or .NET programming In some embodiments a compiler or interpreter is comprised to convert the instruction set into machine executable code for execution by the processor 212.

In some embodiments, the I/O interface 214 may comprise any suitable mechanism or component to at least enable a user to provide input to the units 203, 204 and 205 and the units 203, 204 and 205 to provide output to the user. For example, the I/O interface 214 may comprise any suitable input mechanism, including but not limited to, a button, keypad, keyboard, click wheel, touch screen, or motion sensor. In some embodiments, the I/O interface 214 may comprise a capacitive sensing mechanism, or a multi-touch capacitive sensing mechanism (e.g., a touch screen).

In some embodiments, the I/O interface 214 may comprise a visual peripheral output device for providing a display visible to the user. For example, the visual peripheral output device may comprise a screen such as, for example, a Liquid Crystal Display (LCD) screen, incorporated into the controller 114 of the system 100. As another example, the visual peripheral output device may comprise a movable display or projecting system for providing a display of content on a surface remote from the controller 114 of the system 100. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor 212. For example, the visual peripheral output device may be able to play media playback information, application screens for application implemented the controller 114 of the system 100, information regarding ongoing communications operations, information regarding incoming communications requests, or device operation screens, to name only a few.

In some embodiments, the communications interface 215 may comprise any suitable hardware, software, or combination of hardware and software that is capable of coupling the controller 114 of the system 100 to one or more networks and/or additional devices. The communications interface 215 may be arranged to operate with any suitable technique for controlling information signals using a desired set of communications protocols, services or operating procedures. The communications interface 215 may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 215 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 215 may comprise a wireless interface comprising one or more antennas, transmitters, receivers, transceivers, amplifiers, filters, control logic, and so forth.

In various aspects, the communications interface 215 may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the controller 114 of the system 100 may comprise a system bus 216 that couples various system components including the processor 212, the memory 213, and the I/O interface 214. The system bus 216 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

Figure 3:
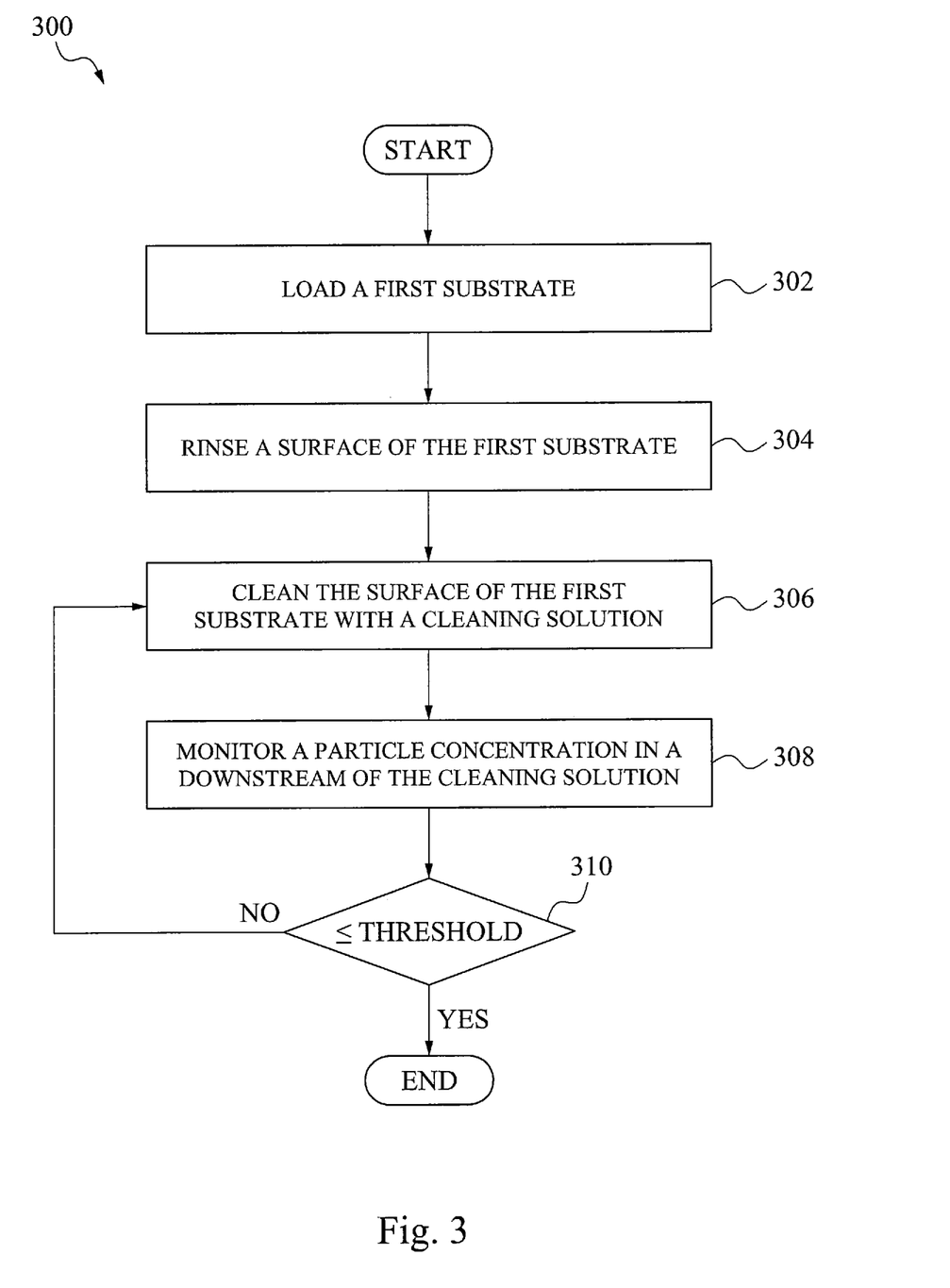
FIG. 3 illustrate a flowchart of a method to perform a cleaning process monitoring in a post CMP cleaning process, in accordance with various embodiments.

FIG. 3 illustrate a flowchart of a method 300 to perform an end point detection in a post CMP cleaning process, in accordance with various embodiments. It is understood that additional operations may be provided before, during, and after the method 300 of FIG. 3, and that some other operations may be omitted or only briefly described herein.

The method 300 starts with operation 302 in which a substrate after chemical mechanical planarization is provided in accordance with some embodiments. In some embodiments, the substrate includes a silicon substrate. Alternatively, the substrate may include other elementary semiconductor material such as, for example, germanium. The substrate may also include a compound semiconductor such as silicon carbide, gallium arsenide, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate may further include other functional features such as a resistor or a capacitor formed in and on the substrate. The substrate further includes lateral isolation features provided to separate various devices formed in the substrate, for example shallow trench isolation (STI). The various devices in the substrate further include silicide disposed on S/D, gate and other device features for reduced contact resistance and enhance process compatibility when coupled between devices through local interconnections.

In an embodiment, the conductive feature can be also introduced on the substrate, which can be a source, drain or gate electrode. Alternatively, the conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In another embodiment, the conductive feature may include an electrode of a capacitor or one end of a resistor.

Excessive materials during the creation of aforementioned conductive features, as well as other structures in integrated circuits, including interconnects, via structures, interlayer dielectrics, can be polished out by a planarization process. A chemical-mechanical planarization (CMP) process is a typical planarization process, in which it utilizes a chemical slurry formulation and mechanical polishing process to remove unwanted conductive or dielectric materials on the substrate, in order to achieve a near-perfect flat and smooth surface. Because of the nature of this cleaning process, a variety of contaminants (e.g., trace metals, mobile ions and organic species) and abrasive materials (e.g., silica and alumina) from the slurry can be introduced to the substrate surface. Therefore, it is important to remove contaminants and materials from substrate after CMP, and reduce slurry residues to the required minimum level in order to potentially maximize device yields. Furthermore, particle contaminants can be also introduced by the cleaning parts, such as brushes, pipes and container.

The method 300 continues with operation 304 in which the substrate from the CMP process is first pre-cleaning rinsed, in accordance with some embodiments. In certain embodiments, the pre-cleaning rinse is using deionized (DI) water. Referring to FIG. 1, the controller 114 closes the valve on the chemical supply 104 and opens the valve on the DI water rinse, which allows only DI water flows to the cleaning apparatus in the cleaning container 106.

The method 300 continues with operation 306 in which the substrate is cleaned in accordance with some embodiments. A typical post-CMP cleaning process is a wet cleaning process, comprising a magasonic cleaning, a brush scrubbing with hydrofluoric (HF) acid, a brush scrubbing with ammonia hydroxide (NH4OH), and a spin-rinse-dry process. A megasonic cleaning is a form of non-contact cleaning method which is commonly used to clean the substrate surface by creating an acoustic wave at megahertz (MHz) frequency range. The acoustic wave in the form of pressure fluctuations propagates through a liquid medium which is used to remove particles from substrate surface by acoustic streaming and/or acoustic cavitation. In some embodiments, the brush scrubbing is used for hydrodynamic removal of particulate contaminants and organic films from the substrate surface by rotation of a nylon or polypropylene brush across the surface by creating a drag, electrostatic double layer and thermophoretic forces on the particles. The relative motion between the brush and the substrate surface causes a thin liquid flow which generates drag on the particle. In some embodiments, the cleaning process monitoring system described in this disclosure can be introduced to at least one of the aforementioned post-CMP cleaning processes in which a wet cleaning is used.

Different chemistries can be used to remove particle contamination with different cleaning methods. The common chemicals used in brush scrubbing include deionized water, surfactants, ammonium hydroxide solution, isopropanol, methanol, hydrofluoric acid, citric acid, tetraethyl ammonium hydroxide (TMAH), a mixture of hydrogen peroxide, ammonium hydroxide and water, and etc.

In some embodiments, a liquid CO2 cryogenic cleaning can be used, in which a directional and focused stream of gaseous CO2 from volume expansion is used to remove the particles by overcome the adhesion forces between the particle and the substrate. In some embodiments, the particle detector 108 can be a gas particle counter.

Besides mechanical wiping and scrubbing, a non-contact post-CMP cleaning process can be also utilized. In some embodiments, a laser based removal method in which a pulsed energetic laser beam is used to heat locally in a thin liquid film on the substrate. The particle removal using this method is due to bubbles created by the superheating of the liquid. In some embodiments, a plasma can be also used for cleaning. In some embodiments, a post-CMP cleaning process can be a combination of aforementioned conventional and newly developed cleaning techniques. Modifications and implementations of the present system described in this disclosure to contact and non-contact post-CMP cleaning process by detecting particle levels in a downstream of cleaning solution (e.g., liquid or gas) will be readily apparent to those skilled in the art.

The method 300 continues with operation 308 in which a concentration of particles of a particular size is detected and monitored in a downstream of a cleaning solution in accordance with some embodiments. Referring to FIG. 1 again, the detection and monitoring is performed by a particle detector 108 integrated to the downstream of the cleaning solution. In some embodiments, the particle detector 108 can be integrated to the drain pipe before the liquid pump to avoid contamination from the pump 110. In some embodiments, the particle detector 108 can be a laser based particle counter. The size and concentration can be determined by measuring the scattered light. In some embodiments, the particle detector 108 comprises an infrared light source according to the detector used.

The method 300 continues with operation 310 in which the particle concentration is compared to a pre-defined threshold value in accordance with some embodiments. Referring to FIG. 2, the concentration of the particle of various sizes is constantly measured during the post-CMP cleaning process and data is transmitted to the controller 114. If the concentration of particles at a particular size is higher than the pre-defined threshold value, the method 300 continues with operation 306 and 308 to allow the continuation of the cleaning process and the particle concentration is continuously monitored. If the concentration of particles at a particular size is lower than the pre-defined threshold value, the cleaning process is then terminated and a second substrate can be loaded after unloading the first substrate from the cleaning container 106.

Different from the traditional recipe-based cleaning method where a cleaning time is fixed for different substrates with potentially different contamination levels, cleaning time can be customized for each substrate individually using this present method. Therefore, this method allows a reduction of cleaning time and thus chemical used. For example, a typical cleaning time in a brush scrubbing process is 40 seconds. If a particle level can reach the threshold in 10 seconds, the cleaning process is terminated at 10 seconds to save time and chemicals. On the other hand, this method enforces an effective cleaning on substrates that requires a longer cleaning time such that its surface contamination can be effectively controlled. Furthermore, this method can also reduce cleaning related surface damages, e.g., scratches from brushes in contact mode, by reducing the cleaning time.

Figure 4:
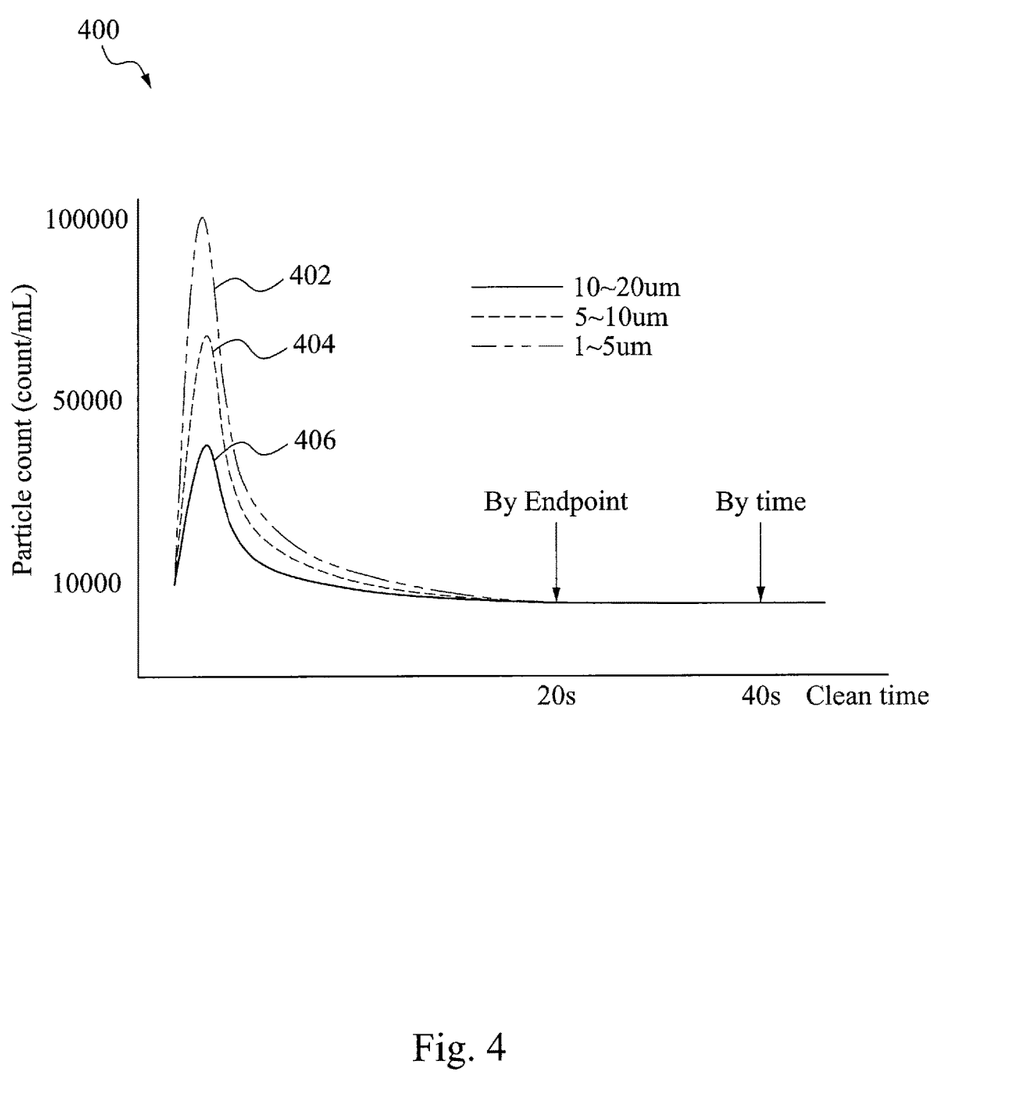
FIG. 4 illustrates an exemplary data showing concentrations of particles of various sizes versus cleaning time, in accordance with various embodiments of the present disclosure.

FIG. 4 illustrates an exemplary data 400 showing concentrations of particles of various sizes versus cleaning time, in accordance with various embodiments of the present disclosure. In certain embodiments, the measured particle concentration for three different sizes of particles each shows a peak corresponding to a sharp increase of particles numbers in the effluent in the drain pipe after the cleaning process is started. All three curves reach the peak at the same time under a fixed flow rate of 6 L/min, according to some embodiments. The red curve 402 corresponds to particles in a size range of 1-5 micrometers shows the highest concentration of ~100000 counts/mL. The blue curve 404 corresponds to particles in a size range of 5-10 micrometers shows a peak particle concentration of 70000 counts/mL. The black curve 406 corresponds to particles in a size range of 10-20 micrometers shows a peak particle concentration of 40000 counts/mL. All three curves show a slow decay of particle concentration and stabilize at a concentration of 10000 counts/mL, which is the pre-defined threshold value, at around 20 seconds. The cleaning process can be then terminated once the measured particle concentration reaches the threshold value.

In some embodiment, a cleaning process monitoring system, comprising: a cleaning container comprising an inlet for receiving a cleaning solution and an outlet for draining a waste solution; a particle detector coupled to the outlet and configured to measure a plurality of particle parameters associated with the waste solution so as to provide a real-time monitoring of the cleaning process; a pump coupled to the cleaning container through the outlet and configured to provide suction to draw the waste solution through the cleaning system; and a controller coupled to the pump and the particle detector and configured to receive the plurality of particle parameters from the particle detector and to control the cleaning system.

In another embodiment, a method for cleaning process monitoring, comprising: cleaning a surface of a first substrate in a cleaning container with a cleaning solution, wherein the cleaning solution is received in an inlet and drained through an outlet; detecting a plurality of particle parameters in the cleaning solution in the outlet; comparing the plurality of particle parameters to a pre-defined end point value; and reconfiguring the cleaning process based on a result from the comparing.

Yet, in another embodiment, a method for cleaning process monitoring, comprising: receiving a first wafer with a first surface for cleaning; cleaning the first surface of the first wafer using a cleaning solution from a supply inlet; draining a waste solution from the first surface of the first wafer in a drain outlet; monitoring a first particle concentration in the waste solution at a first time, wherein the first particle level is further compared to a pre-defined end point value; and terminating the cleaning process if a second particle level received at a second time is equal to or smaller than the pre-defined end point value.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, etc. that is physically constructed, programmed and/or arranged to perform the specified operation or function.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device.

A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A cleaning process monitoring system, comprising:
   a cleaning container comprising an inlet for receiving a cleaning solution and an outlet for draining a waste solution, wherein the cleaning solution comprises a directional and focused stream of gaseous carbon dioxide ($CO_2$);
   a particle detector coupled to the outlet and configured to measure a plurality of particle parameters associated with the waste solution so as to provide a real-time monitoring of the cleaning process, wherein the particle detector comprises a plurality of channels having different sizes from one another, wherein each of the plurality of channels is configured for detecting particles of respective different sizes;
   a pump coupled to the cleaning container through the outlet and configured to provide suction to draw the waste solution through the cleaning system; and
   a controller coupled to the pump and the particle detector and configured to receive the plurality of particle parameters from the particle detector and to control the cleaning system.

2. The system of claim 1, wherein the plurality of particle parameters comprise particle size and particle concentration as a function of cleaning time.

3. The system of claim 1, wherein the particle detector comprises one of the following detectors: optical detector, aerosol detector, liquid detector, solid detector and laser detector.

4. The system of claim 1, wherein the controller is further configured to:
   compare the plurality of particle parameters to a pre-defined end point value;
   configure a flow rate of the waste solution out of the outlet and a flow rate of the cleaning solution into the inlet; and
   transmit the plurality of particle parameters to the host computer for display.

5. The system of claim 1, wherein the controller further terminates the cleaning process if the plurality of particle parameters is equal to or smaller than the pre-defined end point value.

6. The system of claim 4, wherein the pre-defined end point value equals to 10000 particles per milliliter in the waste solution.

7. The system of claim 1, wherein the pre-defined end point value is configured based on the particle size.

8. The system of claim 1, wherein the cleaning container is configured to receive a substrate after a chemical-mechanical planarization (CMP) process is performed on a surface of the substrate.

9. A cleaning process monitoring system, comprising:
   a rinsing solution supply containing a rinsing solution;
   a cleaning solution supply containing a cleaning solution, wherein the cleaning solution comprises a directional and focused stream of gaseous carbon dioxide ($CO_2$);
   a cleaning container comprising an inlet for first receiving the rinsing solution and then the cleaning solution, and an outlet for draining a waste solution;
   a particle detector coupled to the outlet and configured to measure a plurality of particle parameters associated with the waste solution so as to provide a real-time monitoring of the cleaning process, wherein the particle detector comprises a plurality of channels having different sizes from one another, wherein each of the plurality of channels is configured for detecting particles of respective different sizes;
   a pump coupled to the cleaning container through the outlet and configured to provide suction to draw the waste solution through the cleaning system; and
   a controller coupled to the pump and the particle detector and configured to receive the plurality of particle parameters from the particle detector and to control the cleaning system.

10. The system of claim 9, wherein the plurality of particle parameters comprise particle size and particle concentration as a function of cleaning time.

11. The system of claim 9, wherein the particle detector comprises one of the following detectors: optical detector, aerosol detector, liquid detector, solid detector and laser detector.

12. The system of claim 9, wherein the controller is further configured to:
compare the plurality of particle parameters to a pre-defined end point value;
configure a flow rate of the waste solution out of the outlet and a flow rate of the cleaning solution into the inlet; and
transmit the plurality of particle parameters to the host computer for display.

13. The system of claim 9, wherein the controller further terminates the cleaning process if the plurality of particle parameters is equal to or smaller than the pre-defined end point value.

14. The system of claim 12, wherein the pre-defined end point value equals to 10000 particles per milliliter in the waste solution.

15. The system of claim 12, wherein the pre-defined end point value is configured based on the particle size.

16. The system of claim 9, wherein the cleaning container is configured to receive a substrate after a chemical-mechanical planarization (CMP) process is performed on a surface of the substrate.

17. A cleaning process monitoring system, comprising:
a rinsing solution supply containing a rinsing solution;
a cleaning solution supply containing a cleaning solution, wherein the cleaning solution comprises a directional and focused stream of gaseous carbon dioxide ($CO_2$);
a cleaning container comprising an inlet for first receiving the rinsing solution and then the cleaning solution, and an outlet for draining a waste solution;
a particle detector coupled to the outlet and configured to measure a plurality of particle parameters associated with the waste solution so as to provide a real-time monitoring of the cleaning process, wherein the particle detector comprises a plurality of channels having different sizes from one another, wherein each of the plurality of channels is configured for detecting particles of respective different sizes;
a pump coupled to the cleaning container through the outlet and configured to provide suction to draw the waste solution through the cleaning system; and
a controller coupled to the pump and the particle detector and configured to receive the plurality of particle parameters from the particle detector and to control the cleaning system.

18. The system of claim 16, wherein the plurality of particle parameters comprise particle size and particle concentration as a function of cleaning time.

19. The system of claim 17, wherein the controller is further configured to:
compare the plurality of particle parameters to a pre-defined end point value;
configure a flow rate of the waste solution out of the outlet and a flow rate of the cleaning solution into the inlet; and
transmit the plurality of particle parameters to the host computer for display.

20. The system of claim 17, wherein the controller further terminates the cleaning process if the plurality of particle parameters is equal to or smaller than the pre-defined end point value.

\* \* \* \* \*